United States Patent
Schmollngruber et al.

(10) Patent No.: US 7,064,649 B2
(45) Date of Patent: Jun. 20, 2006

(54) MAGNETO-RESISTIVE LAYER ARRANGEMENT AND GRADIOMETER WITH SAID LAYER ARRANGEMENT

(75) Inventors: Peter Schmollngruber, Aidlingen (DE); Henrik Siegle, Leonberg (DE)

(73) Assignee: Robert Bosch GmbH, Stuttgart (DE)

( * ) Notice: Subject to any disclaimer, the term of this patent is extended or adjusted under 35 U.S.C. 154(b) by 12 days.

(21) Appl. No.: 10/344,314

(22) PCT Filed: May 16, 2002

(86) PCT No.: PCT/DE02/01757

§ 371 (c)(1),
(2), (4) Date: Jul. 25, 2003

(87) PCT Pub. No.: WO02/101406

PCT Pub. Date: Dec. 19, 2002

(65) Prior Publication Data

US 2004/0046624 A1 Mar. 11, 2004

(30) Foreign Application Priority Data

Jun. 9, 2001 (DE) .................................. 101 28 135

(51) Int. Cl.
*H01L 43/00* (2006.01)
(52) U.S. Cl. .................................... 338/32 R; 338/204
(58) Field of Classification Search .............. 338/32 R, 338/32 H, 204; 360/324.1, 324.11; 324/207.21, 324/252
See application file for complete search history.

(56) References Cited

U.S. PATENT DOCUMENTS 5,561,368 A * 10/1996 Dovek et al. ................ 324/252
5,569,544 A * 10/1996 Daughton .................... 428/611
5,793,576 A * 8/1998 Gill ............................ 360/113
6,178,071 B1  1/2001 Hasegawa et al.
6,181,533 B1  1/2001 Pokhil (Continued)

FOREIGN PATENT DOCUMENTS

DE      690 19 242      9/1995

(Continued)

OTHER PUBLICATIONS

J.L. Brown et al. "High Sensitivity Magnetic Field Sensor using GMR Materials with Integrated Electronics", 1995 IEEE International Symposium on Circuits and Systems (ISCAS). Seattle, Apr. 30-May 3, 1995, International Symposium on Circuits and Systems (ISCAS), New York, IEEE, US, vol. 3, Apr. 30, 1995, pp. 1864-1867.

(Continued)

*Primary Examiner*—Tu Hoang
(74) *Attorney, Agent, or Firm*—Kenyon & Kenyon LLP (57) ABSTRACT

A magnetoresistive layer system including a layer sequence including at least two magnetic layers, a non-magnetic, electrically conductive intermediate layer being arranged between them; the electrical resistance of the layer system being changeable as a function of an external magnetic field acting on the layer system. At least one magnetically hard layer is integrated in the layer system, at least in certain areas, applying a magnetic field at least in the area of a boundary surface between the magnetic layers and the intermediate layer. The magnetoresistive layer system is suitable in particular for use in a GMR sensor element including coupled multilayers or in an AMR sensor element having a barberpole structure. In addition, the system includes a gradiometer including a plurality of such layer systems.

16 Claims, 3 Drawing Sheets

U.S. PATENT DOCUMENTS

| | | | |
|---|---|---|---|
| 6,198,610 B1 | 3/2001 | Kawawake et al. | |
| 6,452,382 B1 * | 9/2002 | Tokunaga et al. | 324/207.21 |
| 6,462,920 B1 * | 10/2002 | Karimi | 360/327.31 |
| 2001/0028540 A1 * | 10/2001 | Sakaguci et al. | 360/324.12 |
| 2001/0053043 A1 * | 12/2001 | Kanazawa et al. | 360/110 |
| 2003/0021071 A1 * | 1/2003 | Kula et al. | 360/324.1 |
| 2003/0107850 A1 * | 6/2003 | Aoki et al. | 360/324.1 |
| 2004/0080854 A1 * | 4/2004 | Gill | 360/70 |
| 2004/0105191 A1 * | 6/2004 | Min et al. | 360/324.1 |

FOREIGN PATENT DOCUMENTS

| | | |
|---|---|---|
| DE | 197 22 834 | 12/1998 |
| DE | 44 27 495 | 4/2000 |
| DE | 199 49 714 | 4/2001 |
| EP | 0 863 406 | 9/1998 |
| WO | WO 00/79298 | 12/2000 |

OTHER PUBLICATIONS

R. S. Indeck et al., "A Magnestoresistive Gradiometer", IEEE Transactions on Magnetics, IEEE Inc., New York, US, vol. 24, No. 6, Nov. 1, 1988, pp. 2617-2619.

Lenssen et al. "Robust Giant Magnetorresistance Sensors", Sensors and Actuators A, Elsevier Sequoia S.A., Lausanne, CH, vol. 85, No. 1-3, Aug. 25, 2000, pp. 1-8.

G. Binasch et al., Phys. Rev. B, 39 (1989), pp. 4828-4830.

U. Dibbern, "Sensors—A Comprehensive Survey," published by W. Göpel et al., vol. 5, Magnetic Sensors, VCH Verlag, Weinheim, 1989, pp. 342-380.

* cited by examiner

MAGNETO-RESISTIVE LAYER ARRANGEMENT AND GRADIOMETER WITH SAID LAYER ARRANGEMENT

The present invention relates to a magnetoresistive layer system, in particular for use in a GMR sensor element, in an AMR sensor element, or in a gradiometer, as well as to a gradiometer having this layer system according to the definition of the species in the independent claims.

BACKGROUND INFORMATION

Magnetic sensors are widely utilized in motor vehicles, for example as speed sensors at the wheel, as engine speed sensors or phase sensors for the engine control, or as steering angle sensors for vehicle dynamics control systems. The increasing demands for larger operating distances, i.e., appropriately larger air gaps and wider measuring ranges, i.e., wider angle ranges or magnetic field ranges, require increasingly robust sensors.

The GMR technology ("giant magneto resistance") and also the AMR technology ("anisotropic magneto resistance") allow for the manufacture of sensor elements meeting these demands. In particular, coupled multilayer layer systems and spin-valve layer systems having a GMR effect, or also AMR sensor elements having a "barberpole structure," are relevant for the use in motor vehicles.

Coupled multilayer layer systems, known, for example, from G. Binasch et al., Phys. Rev. B, 39 (1989), page 4828 et seq., and M. N. Baibich et al., Phys. Rev. Letters, 61 (1988), page 2472 et seq., are formed from alternating, ultra-thin magnetically soft magnetic and non-magnetic layers, for example, alternating cobalt layers and copper layers, an antiferromagnetic coupling between the adjacent cobalt layers being adjustable via the selection of the thickness of the copper layers. In this way, the directions of magnetization of these magnetic cobalt layers become aligned antiparallel to one another without an external magnetic field, so that the electrical resistance for an electric current carried in the layer system is at its maximum due to the use of a spin-dependent electron dispersion. If, in addition, an external magnetic field is applied, then the magnetizations in the magnetic layers become aligned largely in parallel to it, resulting in a clear decrease in the electrical resistance of the layer system. Effective relative variations of 20% to 30% in resistance are achievable, at room temperature in particular.

Moreover, in the known spin-valve layer systems, a magnetically soft, i.e., soft magnetic detection layer, is separated from a magnetically harder layer by a non-magnetic intermediate layer. The non-magnetic layer has a thickness such that only a slight magnetic coupling between the two magnetic layers takes place via the non-magnetic intermediate layer. This ensures that the direction of magnetization of the magnetically soft layer follows even very weak external magnetic fields. It is furthermore provided there that the direction of magnetization of the magnetically hard layer is aligned and maintained by a layer known as a "pinning layer." If an external magnetic field is applied and its direction is rotated, then the magnetization of the magnetically soft layer follows the direction of this magnetic field, while the direction of magnetization of the magnetically hard layer remains fixed. Thus, the angle of the external magnetic field is carried over to the angle between the directions of magnetization of these two magnetic layers, resulting in an angle-dependent electrical resistance in the layer system. The "spinning layer" is usually designed as an anti-ferro magnet or as a combination of an anti-ferro magnet and an artificial anti-ferro magnet. Details of such spin-valve layer systems are described in German Patent Application 199 49 714 A1.

An overview of magnetoresistive sensor elements, which also includes AMR sensor elements having a barberpole structure, is given by U. Dibbern in "Sensors—A Comprehensive Survey," published by W. Göpel et al., Volume 5, Magnetic Sensors, VCH Verlag, Weinheim, 1989, pages 342 through 380.

It is disadvantageous in known magnetoresistive layer systems, for example in the form of a GMR sensor element having coupled multilayers, that their approximately triangle-shaped characteristic curve, when the relative change in resistance $\Delta R/R$ is plotted as a function of the external magnetic field B or H, runs flat around the zero field, i.e., in the case of a weak external magnetic field, so that such sensor elements are relatively insensitive to a weak external magnetic field.

ADVANTAGES OF THE INVENTION

The magnetoresistive layer system according to the present invention has the advantage over the related art that, by using the magnetically hard layer integrated therein, a displacement of the operating point of the $\Delta R/R$-B characteristic curve of the magnetoresistive layer system is achieved due to the magnetically hard layer applying an internal magnetic field to the layer system, at least in certain areas.

It is additionally advantageous that in the event of utilizing such layer systems in a gradiometer having coupled multilayers, for inductor sampling, for example, the integrated magnetically hard layer makes it possible to select the operating point so that maximum sensitivity of the gradiometer is achieved without requiring an external holding magnet.

In particular, an internal magnetic field, also known as a "bias magnetic field," which acts as a magnetic field offset, is produced by the integrated magnetically hard layer, so that even for a small variation of an external magnetic field, superimposed on an internal magnetic field, of, for example, a few mTesla, a measurable and relatively large change in the actual measured value $\Delta R/R$, detected as a change in the resistance of the layer system, is achieved. In particular, the internal magnetic field produced by the magnetically hard layer prevents the operating point of the magnetoresistive layer system from being located in the range of the zero field, where, according to FIG. 2, this characteristic curve runs relatively flat during the variation of the external magnetic field B or H.

Moreover, it is advantageous that, by using the additionally provided magnetically hard layer, no bias magnetic field needs to be produced via a separate magnet externally mounted on the magnetoresistive layer system. This saves substantial material costs and assembly costs, in particular also for the alignment of such an external magnet during manufacture.

Advantageous refinements of the present invention arise from the measures mentioned in the subclaims.

It is particularly advantageous if the strength of the magnetic field produced by the magnetically hard layer is in the range between 1 mTesla and 30 mTesla, in particular between 2 mTesla and 15 mTesla. A largely optimum displacement of the operating point is achieved by such fields.

It is also advantageous if several layer systems are coupled to a gradiometer that is sensitive to field inhomogeneities; the internal magnetic field, produced by the magnetically hard layer, in the preferably wave-shape structured layer systems is dimensioned so that an at least approximately even magnetic field with regard to strength and direction is applied to all wave areas.

For implementing a gradiometer, for example for sampling inductors during speed detection, several layer systems according to the present invention are advantageously coupled together in the form of a Wheatstone bridge; two of the four resistors of the Wheatstone bridge are spatially located in such a way that the difference of the field strength between the partial bridge, i.e., bridge halves, is at its maximum. In this case it is not the local field strength that is detected via the partial bridge, but rather its difference. In such a gradiometer it is therefore necessary to operate the individual layer systems in the area of the steep slope according to FIG. 2 in order to generate great differential voltages even at small field differences.

In such a gradiometer it is particularly advantageous that direction and strength of the internal bias field, produced in the layer system, is uniformly selectable for all parts of the Wheatstone bridge. Thus, it is not necessary to utilize thin layer hard magnets having different coercivities, for example.

It is furthermore particularly advantageous if the internal magnetic field produced is applied to the sensitive layer sequence of the magnetoresistive layer system at least approximately evenly so that the magnetic layers and the electrically conductive intermediate layers are exposed to a largely even internal magnetic field.

Provided the magnetoresistive layer system according to the present invention is designed in the form of coupled multilayers, it is also advantageous if the sensitive layer sequence is composed of a plurality of magnetically soft layers situated on top of one another and each separated from one another by an intermediate layer. In this way, the overall obtainable sensor signal is substantially amplified by addition of the signals of the individual intermediate layers.

With regard to the placement of the magnetically hard layer integrated in the layer system there is an advantageous plurality of possibilities which may be adapted to the concrete requirements according to each individual case. It is particularly advantageous if the magnetically hard layer is situated on the sensitive layer sequence and/or under the sensitive layer sequence and/or at least in certain areas laterally on one side or on both sides next to the sensitive layer sequence. These placements of the magnetically hard layer are particularly easily integratable into the manufacturing process and allow for a simple and reliable manufacture of the magnetically hard layer.

Moreover, it is advantageous that due to the integration of the magnetically hard layer into the layer system, the latter may now have almost any desired structure. This makes it possible to simply place the magnetically hard layer in certain areas on, under, or next to the actual sensitive layer sequence so that due to the special geometrical shape of the magnetically hard layer, which is used as a thin layer bias magnet, a new range of functions of the magnetoresistive layer system according to the present invention is implementable. In particular, non-linearities in position sensors may be compensated in that way.

It is further advantageous that the displacement of the operating point of a magnetoresistive layer system provided according to the present invention is also usable in AMR sensor elements based on barberpole structures via integration of a magnetically hard layer which is used as a thin layer bias magnet. There also, an external holding magnet, used for stabilization, may be substituted by a magnetically hard layer integrated in an appropriate layer system.

With regard to materials for the magnetically hard layer, all magnetically hard materials depositable by using thin layer technology are suitable in principle, e.g., SmCo, NdFeB, CoPt, or CoCr. The coercivity of the magnetically hard layer is advantageously selected such that the direction of magnetization of the magnetically hard layer at its deposition may still be easily impressed using manufacturing technology, e.g., by applying an appropriate magnetic field during deposition, without causing irreversible changes due to an external magnetic field, or sensor field, or other interference fields during use of the magnetoresistive layer system according to the present invention in the low field strength range under 100 mTesla.

BRIEF DESCRIPTION OF THE DRAWING

The present invention is explained in greater detail in the following description and on the basis of the drawing.

DETAILED DESCRIPTION OF THE EXEMPLARY EMBODIMENTS

Figure 1:
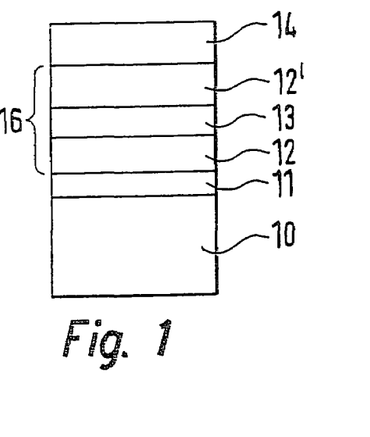
FIG. 1 schematically shows a magnetoresistive layer system for a GMR sensor element including coupled multilayers as known from the related art.

As illustrated in FIG. 1, a first exemplary embodiment is directed to an essentially known magnetoresistive layer system based on coupled multilayers which has a GMR effect under the influence of an external magnetic field B or H and which is thus suitable for use in a GMR sensor element, for example.

In particular, this magnetoresistive layer system includes a substrate 10 made of silicon dioxide or silicon, on which a buffer layer or adaptor layer 11, made of iron or NiFe, for example, is provided. A thin first magnetically soft layer 12 is situated on buffer layer 11, layer 12 being composed of an alloy of iron and cobalt, for example 80 atomic % to 95 atomic % of cobalt and 20 atomic % to 5 atomic % of iron, of cobalt or of an alloy of nickel and iron or nickel and cobalt. The thickness of first magnetically soft layer 12 ranges from approximately 0.5 nm to approximately 3 nm.

A magnetically soft layer is understood to be a layer made of a ferromagnetic material where the direction of magnetization in the layer is influenceable by an external magnetic field. In particular, the magnetization in a magnetically soft layer is aligned as easily and as much as possible parallel to the direction of the magnetic field. In contrast, a magnetically hard layer is understood to be a layer made of a ferromagnetic material where the direction of magnetization and in particular its strength remains largely uninfluenced, except for extremely strong external fields.

A copper layer as a non-magnetic electrically conductive intermediate layer 13 is situated on first magnetically soft layer 12. The thickness of the copper layer ranges from 1 nm to 4 nm, in particular 2 nm to 2.5 nm. Intermediate layer 13 may alternatively be composed of an alloy of copper, silver, and gold, for example 80 atomic % to 90 atomic % of copper, 5 atomic % to 15 atomic % of silver, and 2 atomic % to 8 atomic % of gold.

A second magnetically soft layer 12', designed similarly to first magnetically soft layer 12, is applied on intermediate layer 13. The two magnetic layers 12, 12' and directly adjacent intermediate layer 13, situated between them, thus form a layer sequence 16, which is preferably covered on its top side by a protective layer 14 made of tantalum, for example, for protection against corrosion and environmental effects. Buffer layer 11 and/or protective layer 14 may be omitted.

Different from the simplified illustrations according to FIG. 1 and FIGS. 3a through 3c, layer sequence 16 preferably has a plurality of stacks composed of first magnetic layer 12, intermediate layer 13, and second magnetic layer 12', situated on top of one another. This is exemplified on the basis of FIG. 5.

The thickness of intermediate layer 13 is selected such that the two magnetically soft layers 12, 12' are coupled antiferromagnetically via intermediate layer 13 in the absence of an external magnetic field, i.e., their respective magnetizations are aligned anti-parallel to one another in the absence of an external magnetic field.

Figure 2:
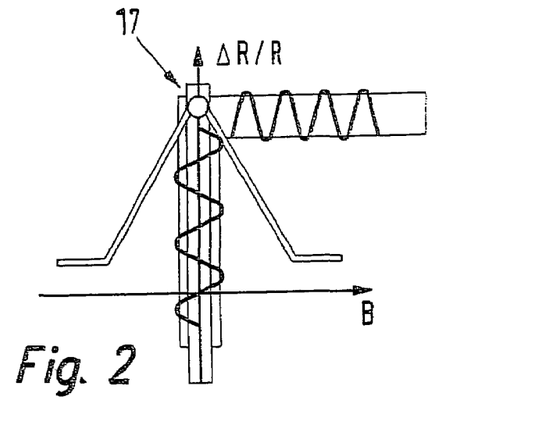
FIG. 2 shows a block diagram of a characteristic curve of such a layer system.

FIG. 2 shows a block diagram of the characteristic curve of the magnetoresistive layer system according to FIG. 1, the change in the electrical resistance of layer sequence 16, with respect to the minimum electrical resistance for a large magnetic field, i.e., value ΔR/R, being depicted as a function of an external magnetic field (B). The external magnetic field has a defined, fixed direction in the first quadrant of the characteristic curve according to FIG. 2, while the characteristic curve in the fourth quadrant according to FIG. 2 represents a similar external magnetic field, however oriented in the opposite direction.

It is apparent in FIG. 2 that, for example, in the case of a periodical variation of the external magnetic field B around the zero field, i.e., in the case of a weak external magnetic field of less than 5 mTesla, value ΔR/R, i.e., the response of the sensor element, fluctuates only slightly due to the flat shape of the characteristic curve.

Figure 3A:
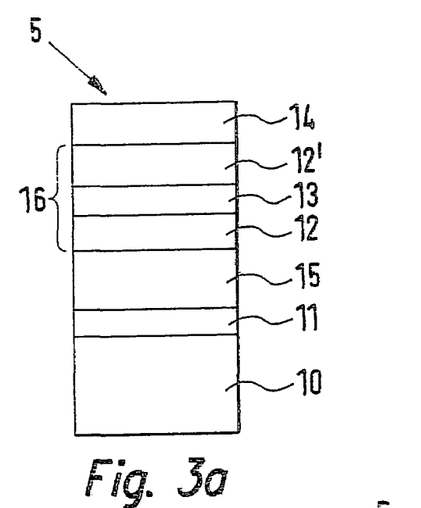
FIGS. 3a, 3b, and 3c each show an exemplary embodiment of a magnetoresistive layer system according to the present invention.

As a first exemplary embodiment of a resistive layer system according to the present invention, FIG. 3a shows a layer system 5 which initially has a structure similar to FIG. 1, however, an additional magnetically hard layer 15 is provided between buffer layer 11 and first magnetically soft layer 12. This magnetically hard layer 15 is composed, for example, of a SmCo alloy, a NdFeB alloy, a CoPt alloy, a CoCr alloy, or of a different magnetically hard material depositable by using thin layer technology. When creating magnetically hard layer 15, a further magnetic field has been applied so that magnetically hard layer 15 has a specified magnetization with regard to strength and direction, which is at least largely constant over time. With regard to direction and strength, the magnetization of magnetically hard layer 15 is at least largely uninfluenced by an external magnetic field to which magnetoresistive layer system 5 is exposed during operation in a sensor element for example. Magnetically hard layer 15 forms a thin layer bias magnet integrated in magnetoresistive layer system 5. The thickness of magnetically hard layer 15 ranges, for example, from 30 nm to 500 nm, e.g., approximately 150 nm.

Figure 3B:
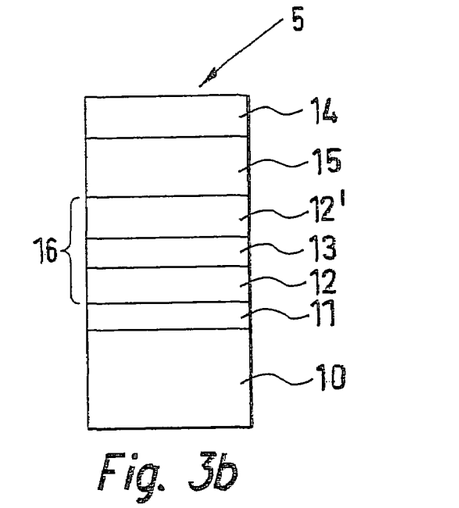

FIG. 3b explains a second exemplary embodiment of a magnetoresistive layer system 5 according to the present invention where in contrast to FIG. 3a magnetically hard layer 15 is situated on layer sequence 16 or on second magnetically soft layer 12', between the latter and protective layer 14. Magnetically hard layer 15 according to FIG. 3b is otherwise similar to magnetically hard layer 15 according to FIG. 3a.

Figure 3C:
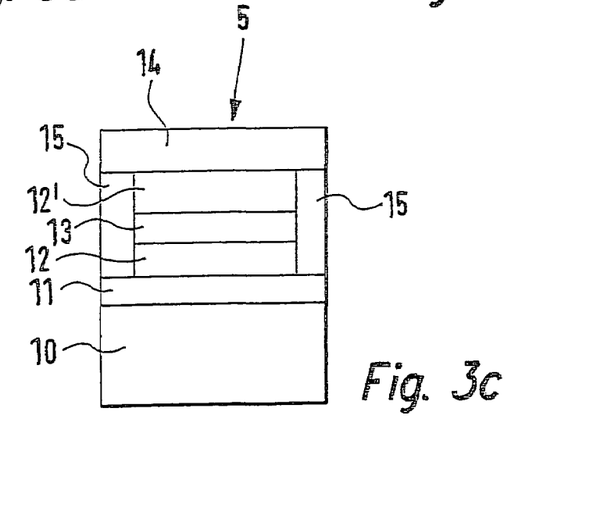

FIG. 3c explains a third exemplary embodiment of the present invention, magnetically hard layer 15 being situated laterally on both sides of layer sequence 16 formed by magnetic layers 12, 12' and intermediate layer 13.

Figure 5:
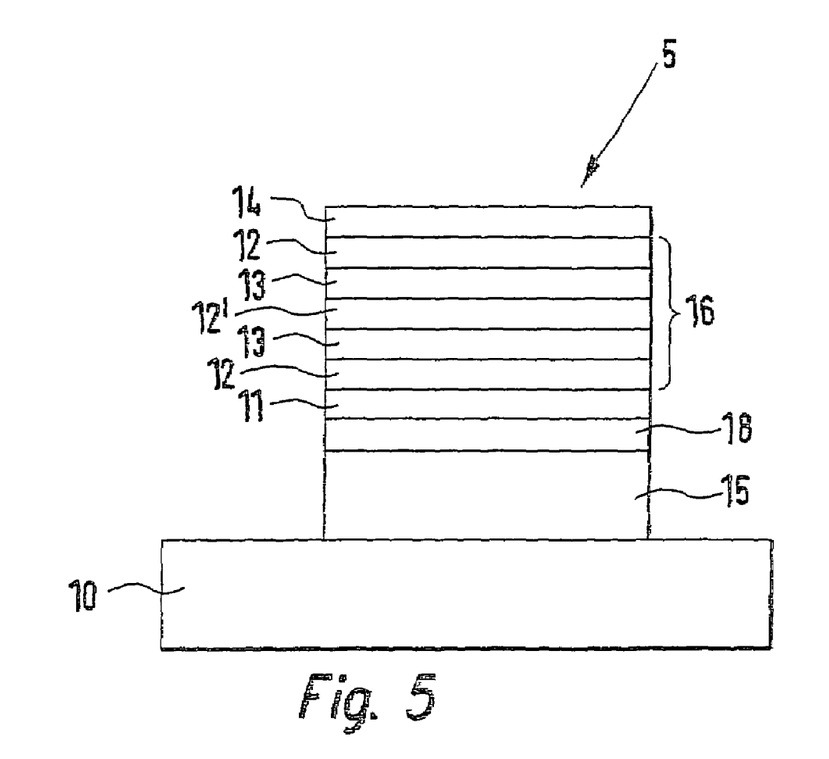
FIG. 5 shows an additional exemplary embodiment of a magnetoresistive layer system according to the present invention.

FIG. 5 finally shows a layer sequence 16 of several, preferably a plurality of stacks composed of first magnetic layer 12, intermediate layer 13, and second magnetic layer 12' situated on top of one another. Also in FIG. 5, magnetically hard layer 15 is situated directly on substrate 10 and is initially separated from layer sequence 16 by an insulation layer 18 and a buffer layer 11 produced thereon.

Figure 4:
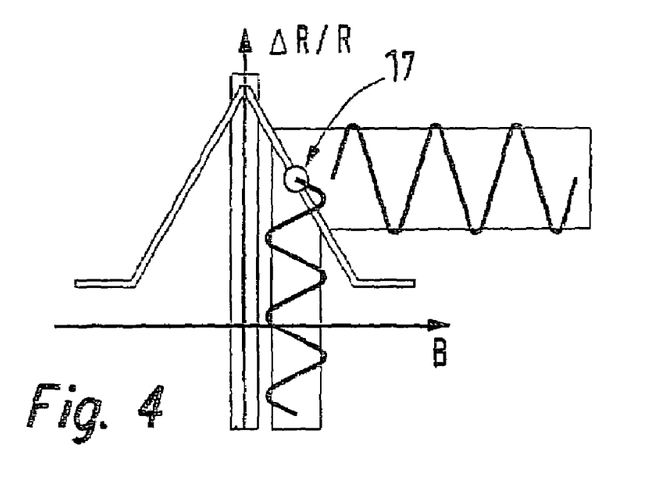
FIG. 4 shows a block diagram of a characteristic curve of a layer system according to FIGS. 3a, 3b, and 3c.

FIG. 4 explains how a displacement of operating point 17 in the characteristic curve of magnetoresistive layer system 5 is achieved by integrating magnetically hard layer 15 in the form of a thin layer bias magnet into layer system 5. In comparison to FIG. 2 it is clearly recognizable that a displacement of operating point 17 from the zero field is achieved via the internal magnetic field, produced by magnetically hard layer 15 and measuring between 1 mTesla and 30 mTesla, in particular 2 mTesla to 15 mTesla. In particular, operating point 17 lies on the steep slope of the characteristic curve according to FIG. 4 so that even small changes in a magnetic field, applied from the outside, clearly cause a larger change in value ΔR/R, which ultimately forms the actual sensor signal.

Figure 6:
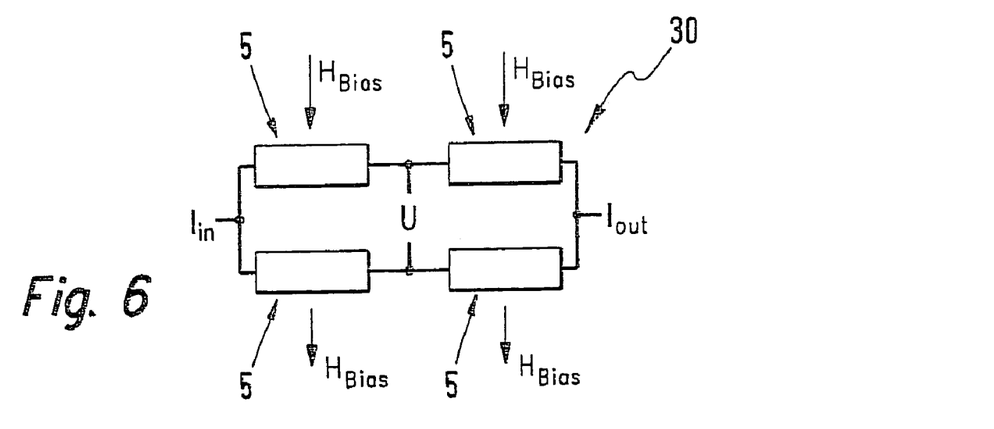
FIG. 6 shows a block diagram of a gradiometer having four magnetoresistive layer systems interconnected in the form of a Wheatstone bridge.

As a block diagram, FIG. 6 shows the coupling of several layer systems 5 to a gradiometer 30 using a known Wheatstone bridge according to FIG. 3a, 3b, 3c, or 5, the strength and direction of internal magnetic field $H_{Bias}$, produced by magnetically hard layer 15 in layer systems 5, being the same in all layer systems. The difference in field strength of an external magnetic field between both bridge halves 19, 20 of the Wheatstone bridge is thus detectable.

Figure 7:
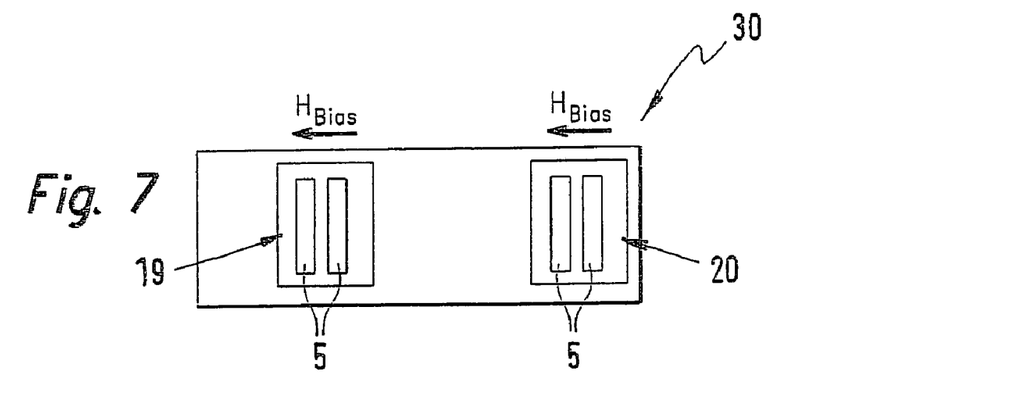
FIG. 7 shows a top view of appropriately structured layer systems on a substrate, and, in continuation of FIG. 7.

Such a gradiometer 30 is explained in greater detail in FIG. 7 which shows the four layer systems 5, according to FIG. 5, on a substrate in top view, these being structured in pairs to adjacent strips. In this case also, the strengths and directions of internal magnetic fields $H_{Bias}$ are the same in all layer systems. Individual layer systems 5 in FIG. 7 are, similar to FIG. 6, coupled in the form of a Wheatstone bridge using printed conductors (not shown).

Figure 8:
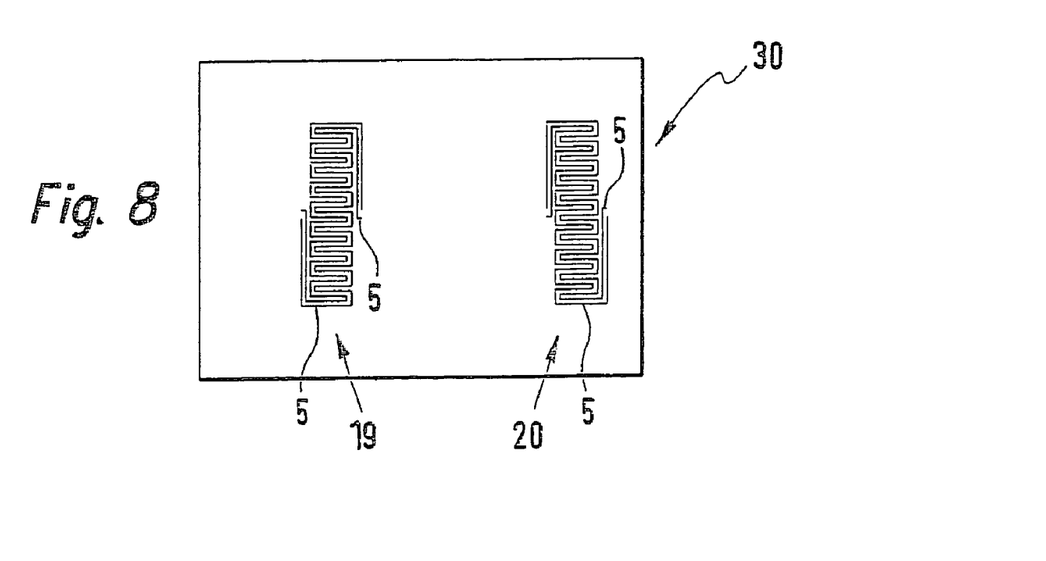
FIG. 8 shows wave-shape structured layer systems combined into a gradiometer.

In continuation of FIG. 7, FIG. 8 shows a gradiometer 30, the individual layer systems 5 in top view being structured in a wave shape and situated next to one another in pairs. In this way two bridge halves 19, 20 are formed which are coupled to a Wheatstone bridge via printed conductors (not shown).

What is claimed is:
1. A magnetoresistive layer system for use in one of a GMR sensor element, an AMR sensor element, and a gradiometer, the magnetoresistive layer system comprising:
 a layer sequence including at least two magnetic layers, wherein the at least two magnetic layers are magnetically soft layers made of a ferromagnetic material, and wherein a direction of magnetization in the magnetically soft layers is capable of being influenced by an external magnetic field;

a non-magnetic electrically conductive intermediate layer arranged between the at least two magnetic layers; and at least one magnetically hard layer integrated in the magnetoresistive layer system at least in certain areas to apply a magnetic field to at least an area of a boundary surface between the at least two magnetic layers and the non-magnetic electrically conductive intermediate layer; wherein:

the magnetic field of the at least one magnetically hard layer displaces an operating point in a characteristic curve of the magnetoresistive layer system, and an electrical resistance of the magnetoresistive layer system is changeable as a function of an external magnetic field acting on the magnetoresistive layer system.

2. The magnetoresistive layer system of claim 1, wherein an internal magnetic field, produced by the at least one magnetically hard layer, is at least largely constant over time with regard to strength and direction and remains at least largely uninfluenced by the external magnetic field.

3. The magnetoresistive layer system of claim 1, wherein an internal magnetic field, produced by the at least one magnetically hard layer, has a direction and strength set during creation of the at least one magnetically hard layer.

4. The magnetoresistive layer system of claim 1, wherein, in the area of the boundary surface, a strength of an internal magnetic field, produced by the at least one magnetically hard layer, is in a range of between 1 mTesla and 30 mTesla.

5. The magnetoresistive layer system of claim 4, wherein the strength of the internal magnetic field is in a range of between 2 mTesla and 15 mTesla.

6. The magnetoresistive layer of claim 1, wherein the at least one magnetically hard layer is integrated into the magnetoresistive layer system and an internal magnetic field induced by the at least one magnetically hard layer is dimensioned so that it extends, at least in certain areas, over the layer sequence and acts upon it approximately uniformly.

7. The magnetoresistive layer system of claim 1, wherein the at least one magnetically hard layer includes one of SmCo, NdFeB, CoPt, CoCr, and another magnetically hard material depositable by using thin layer technology.

8. The magnetoresistive layer system of claim 1, wherein the layer sequence includes a plurality of superposed magnetically soft layers, which are separated from one another by the non-magnetic electrically conductive intermediate layer, at least in certain areas.

9. The magnetoresistive layer system of claim 1, wherein the at least one magnetically hard layer is arranged on the layer sequence in at least one of the following arrangements:

in certain areas of the layer sequence, under the layer sequence in certain areas of the layer sequence, and laterally on one of one side and both sides next to the layer sequence at least in certain areas of the layer sequence.

10. The magnetoresistive layer system of claim 1, wherein the at least one magnetically hard layer is separated from the layer sequence by a barrier layer.

11. The magnetoresistive layer system of claim 10, wherein the barrier layer includes an electrically insulating barrier layer.

12. The magnetically sensitive layer system of claim 1, wherein the at least one magnetically hard layer includes a structure and is arranged at least one of on and under the layer sequence only in certain areas.

13. The magnetically sensitive layer system of claim 1, wherein at least one of the at least two magnetic layers includes at least one of:

one of Fe, Co, and Ni, and one of NiFe, CoFe, NiCo, and Co.

14. A gradiometer, comprising:

a plurality of magnetoresistive layer systems;

wherein at least one of the magnetoresistive layer systems has an electrical resistance that is changeable as a function of an external magnetic field acting on the at least one of the magnetoresistive layer systems, and includes:

a layer sequence including at least two magnetic layers, wherein the at least two magnetic layers are magnetically soft layers made of a ferromagnetic material, and wherein a direction of magnetization in the magnetically soft layers is capable of being influenced by an external magnetic field;

a non-magnetic electrically conductive intermediate layer arranged between the at least two magnetic layers; and at least one magnetically hard layer integrated in the magnetoresistive layer system at least in certain areas to apply a magnetic field to at least an area of a boundary surface between the at least two magnetic layers and the non-magnetic electrically conductive intermediate layer, wherein:

the magnetic field of the at least one magnetically hard layer displaces an operating point in a characteristic curve of the magnetoresistive layer system.

15. The gradiometer of claim 14, wherein an magnetic field produced by the at least one magnetically hard layer is at least approximately the same in the plurality of magnetoresistive layer systems with regard to strength and direction.

16. The gradiometer of claim 14, wherein the plurality of magnetoresistive layer systems are coupled to a Wheatstone bridge.

* * * * *

UNITED STATES PATENT AND TRADEMARK OFFICE
CERTIFICATE OF CORRECTION

| | |
|---|---|
| PATENT NO. | : 7,064,649 B2 |
| APPLICATION NO. | : 10/344314 |
| DATED | : June 20, 2006 |
| INVENTOR(S) | : Peter Schmollngruber |

It is certified that error appears in the above-identified patent and that said Letters Patent is hereby corrected as shown below:

Column 1, lines 8-9, change "having this layer system according to the definition of the species in the independent claims." to --including this layer system.--

Column 1, lines 28-29, change "known, for example, from" to --are referred to in--

Column 1, line 31, change "are formed from" to --which are formed from--

Column 1, line 36, change "In this way," to --In this manner,--

Column 1, line 47, change "in the known" to --in the other--

Column 1, line 52, change "takes place via" to --occurs via--

Column 1, line 57, change "layer known as" to --layer referred to as--

Column 1, line 66, change "is usually designed as" to --is usually configured as--

Column 2, lines 2-3, change "are described in German Patent Application 199 49 714 A1" to --are referred to in German Published Patent No. 199 49 714.--

Column 2, line 10, change "It is disadvantageous in known" to --In other--

Column 2, line 12, change "having coupled mutilayers, that" to --including coupled multilayers, provide that--

Column 2, line 20, change "ADVANTAGES OF THE INVENTION" to -- SUMMARY OF THE INVENTION--

Column 2, line 23, change "has the advantage over the related art that," to --may provide that,--

Column 2, line 30, change "It is additionally advantageous that in the event" to --In the event--

Column 2, line 31, change "a gradiometer having" to --a gradiometer including--

Column 2, line 33, change "makes it possible to select" to --may allow for selection of--

UNITED STATES PATENT AND TRADEMARK OFFICE
CERTIFICATE OF CORRECTION

| | |
|---|---|
| PATENT NO. | : 7,064,649 B2 |
| APPLICATION NO. | : 10/344314 |
| DATED | : June 20, 2006 |
| INVENTOR(S) | : Peter Schmollngruber |

It is certified that error appears in the above-identified patent and that said Letters Patent is hereby corrected as shown below:

Column 2, line 37, change "also known as" to --also referred to as--

Column 2, line 51, delete "it is advantageous that,"--

Column 2, lines 58-60, change "Advantageous refinements of the present invention arise from the measures mentioned in the subclaims. It is particularly advantageous if the strength" to --The strength--

Column 2, line 61, change "hard layer is" to --hard layer may be--

Column 2, line 66, change "It is also advantageous if several layer systems are" to -- Several layer systems may be--

Column 3, line 2, delete "preferably"

Column 3, line 8, change "are advantageously" to --may be--

Column 3, line 11, change "in such a way" to --in such a manner--

Column 3, line 19, delete "it is particularly advantageous that"

Column 3, line 20, change "direction and strength" to --the direction and strength--

Column 3, line 21, change "is uniformly acceptable" to --may be uniformly acceptable--

Column 3, line 25, change "It is furthermore particularly advantageous if the internal" to --The internal--

Column 3, line 26, change "is applied to" to --may be applied to--

Column 3, line 32, change "is designed in" to --is configured in--

Column 3, line 33, delete "it is also advantageous if"

Column 3, line 34, change "sequence is composed" to --sequence may be composed--

Column 3, line 35, change "layers situated on top" to --layers arranged on top--

UNITED STATES PATENT AND TRADEMARK OFFICE
CERTIFICATE OF CORRECTION

PATENT NO. : 7,064,649 B2
APPLICATION NO. : 10/344314
DATED : June 20, 2006
INVENTOR(S) : Peter Schmollngruber It is certified that error appears in the above-identified patent and that said Letters Patent is hereby corrected as shown below:

Column 3, line 36, change "In this way," to --In this manner,--

Column 3, lines 41-42, change "an advantageous plurality" to --a plurality--

Column 3, lines 42-43, change "It is particularly advantageous if the" to --The--

Column 3, line 44, change "situated on" to --may be arranged on--

Column 3, line 49, change "a simple and reliable" to --an effective and reliable--

Column 3, line 51, delete "it is advantageous that"

Column 3, line 53, change "may now have almost any desired structure." to --may have almost any structure.--

Column 3, lines 53-54, change "This makes it possible to simply place" to --This may allow for arranging--

Column 3, line 61, change "in that way" to --in that manner--

Column 3, line 62, change "It is further advantageous that the" to --The--

Column 3, line 64, change "is also usable" to --may also be usable--

Column 4, line 7, delete "advantageously"

Column 4, line 17, change "BRIEF DESCRIPTION OF THE DRAWING" to -- BRIEF DESCRIPTION OF THE DRAWINGS--

Column 4, lines 19-40, delete and replace with the following:

--Figure 1 schematically shows a magnetoresistive layer system for a GMR sensor element including coupled multilayers as from other systems.

Figure 2 shows a block diagram of a characteristic curve of such a layer system.

Figure 3a shows an exemplary embodiment of a magnetoresistive layer system according to the present invention.

UNITED STATES PATENT AND TRADEMARK OFFICE
CERTIFICATE OF CORRECTION

PATENT NO.       : 7,064,649 B2
APPLICATION NO. : 10/344314
DATED            : June 20, 2006
INVENTOR(S)      : Peter Schmollngruber Page 4 of 6

It is certified that error appears in the above-identified patent and that said Letters Patent is hereby corrected as shown below:

Figure 3b shows an exemplary embodiment of a magnetoresistive layer system according to the present invention.

Figure 3c shows an exemplary embodiment of a magnetoresistive layer system according to the present invention.

Figure 4 shows a block diagram of a characteristic curve of a layer system according to Figures 3a, 3b, and 3c.

Figure 5 shows an additional exemplary embodiment of a magnetoresistive layer system according to the present invention.

Figure 6 shows a block diagram of a gradiometer including four magnetoresistive layer systems interconnected in the form of a Wheatstone bridge.

Figure 7 shows a top view of appropriately structured layer systems on a substrate, and, in continuation of Figure 7.

Figure 8 shows wave-shape structured layer systems combined into a gradiometer.--

Column 4, lines 42-43, delete "OF THE EXEMPLARY EMBODIMENTS"

Column 4, line 45, change "As illustrated in" to --As shown in--

Column 4, line 46, change "directed to an essentially known" to --related to a--

Column 4, line 47, change "system based on" to --system of other systems based on--

Column 4, line 55, change "is situated in" to --is arranged in--

Column 5, line 5, change "is situated on" to --is arranged on--

Column 5, line 12, change "designed similarly" to --configured similarly--

Column 5, line 15, change "situated between them," to --arranged between them,--

Column 5, line 16, change "is preferably covered" to --may be covered--

UNITED STATES PATENT AND TRADEMARK OFFICE
CERTIFICATE OF CORRECTION

PATENT NO. : 7,064,649 B2
APPLICATION NO. : 10/344314
DATED : June 20, 2006
INVENTOR(S) : Peter Schmollngruber It is certified that error appears in the above-identified patent and that said Letters Patent is hereby corrected as shown below:

Column 5, line 21, delete "simplified"

Column 5, lines 22-23, change, "preferably has a" to --may include a--

Column 5, line 25, change "situated on top" to --arranged on top--

Column 6, line 4, change "FIG. 3b explains" to --FIG. 3b shows--

Column 6, line 7, change "is situated on" to --is arranged on--

Column 6, line 12, change "FIG. 3c explains" to --FIG 3c shows--

Column 6, line 13, change "being situated" to --being arranged--

Column 6, line 16, delete "finally"

Column 6, line 17, change "preferably" to --which may be--

Column 6, line 19, change "situated on top" to --arranged on top--

Column 6, line 20, change "situated directly on" to --arranged directly on--

Column 6, line 23, change "FIG. 4 explains" to --FIG. 4 shows--

Column 6, line 39, delete "known"

Column 6, line 56, change "and situated next to" to --and arranged next to--

UNITED STATES PATENT AND TRADEMARK OFFICE
CERTIFICATE OF CORRECTION

PATENT NO. : 7,064,649 B2
APPLICATION NO. : 10/344314
DATED : June 20, 2006
INVENTOR(S) : Peter Schmollngruber It is certified that error appears in the above-identified patent and that said Letters Patent is hereby corrected as shown below:

Column 6, line 57, change "this way" to --this manner--

Signed and Sealed this

Sixth Day of March, 2007

JON W. DUDAS
*Director of the United States Patent and Trademark Office*